United States Patent
Tsuyama et al.

(10) Patent No.: US 9,543,898 B2
(45) Date of Patent: Jan. 10, 2017

(54) MICROWAVE AMPLIFIER DEVICE

(71) Applicant: Mitsubishi Electric Corporation, Chiyoda-ku (JP)

(72) Inventors: Yoshinori Tsuyama, Chiyoda-ku (JP); Hiroyuki Nonomura, Chiyoda-ku (JP); Hiroshi Otsuka, Chiyoda-ku (JP); Hifumi Noto, Chiyoda-ku (JP); Yoshinori Yasunaga, Chiyoda-ku (JP); Mitsuhiro Shimozawa, Chiyoda-ku (JP); Yuichi Fujimoto, Shinagawa-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/429,040

(22) PCT Filed: Sep. 13, 2013

(86) PCT No.: PCT/JP2013/074857
§ 371 (c)(1),
(2) Date: Mar. 18, 2015

(87) PCT Pub. No.: WO2014/050611
PCT Pub. Date: Apr. 3, 2014

(65) Prior Publication Data
US 2015/0222231 A1    Aug. 6, 2015

(30) Foreign Application Priority Data

Sep. 25, 2012  (JP) ................................. 2012-210863

(51) Int. Cl.
*H03F 3/191*  (2006.01)
*H03F 1/02*   (2006.01)
(Continued)

(52) U.S. Cl.
CPC .......... *H03F 1/0205* (2013.01); *H03F 1/3205* (2013.01); *H03F 3/19* (2013.01);
(Continued)

(58) Field of Classification Search
CPC ................................. H03F 3/60; H03F 3/191
(Continued)

(56) References Cited

U.S. PATENT DOCUMENTS 6,124,767 A       9/2000  Woods
6,166,599 A  *  12/2000  Aparin .................. H03F 1/3241
                                                                    330/149

(Continued)

FOREIGN PATENT DOCUMENTS

CN       1315074 A      9/2001
CN     102474228 A      5/2012

(Continued)

OTHER PUBLICATIONS

Extended European Search Report issued Apr. 20, 2016 in Patent Application No. 13840282.1.

(Continued)

*Primary Examiner* — Steven J Mottola
(74) *Attorney, Agent, or Firm* — Oblon, McClelland, Maier & Neustadt, L.L.P.

(57) ABSTRACT

A microwave amplifier including: a bias circuit that includes a line having an electrical length of one quarter the wavelength at the frequency configured to be amplified by the microwave amplifier and being connected between the output terminal of an amplifier and a bias voltage source, and a capacitor connected between a terminal where the line is connected to the bias voltage source and a ground that defines the reference potential of the microwave amplifier; and a resonant circuit that includes a resistor and a capacitor (Continued)

connected in series between the ground and the terminal where the line is connected to the bias voltage source.

3 Claims, 4 Drawing Sheets

(51) Int. Cl.
    *H03F 3/24* (2006.01)
    *H03F 3/19* (2006.01)
    *H03F 3/60* (2006.01)
    *H03F 1/32* (2006.01)

(52) U.S. Cl.
    CPC ............. *H03F 3/245* (2013.01); *H03F 3/601* (2013.01); *H03F 2200/108* (2013.01); *H03F 2200/12* (2013.01); *H03F 2200/267* (2013.01); *H03F 2200/391* (2013.01); *H03F 2200/555* (2013.01)

(58) Field of Classification Search
    USPC .................................................. 330/286, 302
    See application file for complete search history.

(56) References Cited

U.S. PATENT DOCUMENTS

| | | |
|---|---|---|
| 2002/0014923 A1 | 2/2002 | Saitou |
| 2004/0085138 A1 | 5/2004 | Franca-Neto |
| 2011/0098013 A1 | 4/2011 | Takahashi et al. |

FOREIGN PATENT DOCUMENTS

| | | |
|---|---|---|
| JP | 62 209909 | 9/1987 |
| JP | 9-83269 | 3/1997 |
| JP | 11 41042 | 2/1999 |
| JP | 11 136045 | 5/1999 |
| JP | 2003 17948 | 1/2003 |
| JP | 2003 23325 | 1/2003 |
| JP | 2003 298364 | 10/2003 |
| JP | 2005 341447 | 12/2005 |
| JP | 2011 97160 | 5/2011 |

OTHER PUBLICATIONS

International Search Report Issued Oct. 29, 2013 in PCT/JP2013/074857 Filed Sep. 13, 2013.

Office Action mailed Aug. 15, 2016 in Chinese Application No. 201380050039.8 (w/English translation).

Office Action mailed Oct. 18, 2016 in Japanese Application No. 2012-210863 filed Sep. 25, 2012 (w/partial English translation).

\* cited by examiner

MICROWAVE AMPLIFIER DEVICE

TECHNICAL FIELD

The present disclosure relates to a microwave amplifier used in high-frequency bands such as microwave and millimetric wave bands using an active element. The present disclosure further relates to a microwave amplifier in which a plurality of communication carriers having different frequencies is simultaneously input.

BACKGROUND ART

For microwave amplifiers used in communication-related applications, there are instances in which a plurality of communication carriers having different frequencies in a fixed operating band is input simultaneously. However, for microwave amplifiers, mutual interaction may occur between a plurality of communication carriers due to the generation of a beat signal between the plurality of communication carriers with different frequencies.

Patent Literature 1, for example, proposes a microwave amplifier which has a good distortion characteristic even when many communication carrier frequencies are included in a microwave signal configured to be amplified. For the microwave amplifier in Patent Literature 1, a filter circuit which becomes a high impedance with the communication carrier frequency of a microwave signal and becomes a low impedance with the frequency of a beat signal that is generated from a plurality of communication carrier frequencies is connected to a drain of a field effect transistor (FET). Further, a capacitor which short-circuits a beat signal is connected between the other end and a ground (GND).

Also, Patent Literature 2, discloses about reducing significantly the gain in low frequency bands which causes a problem when amplifying a plurality of communication carriers of a microwave amplifier, and reducing low frequency components on the input and output side of an amplifier. In the microwave amplifier of Patent Literature 2, ends of bias supply lines having predetermined lengths are connected to a connecting point of a microwave amplifier circuit having a semiconductor element and an input side transmission line, and to a connecting point of the microwave amplifier circuit and an output side transmission line respectively. Capacitors are connected to other ends of the bias supply lines, respectively. A parallel circuit consisting of a resistor and a capacitor is loaded between the connecting point of the input side bias circuit to the input side transmission line and the input terminal of the microwave amplifier circuit.

It is known that, in microwave amplifiers, a resistor is added to a bias supply circuit in order to reduce ultra-high frequency power losses and stabilize operation of semiconductor elements at low frequencies. In Patent Literature 3, for example, the ultra-high frequency semiconductor circuit is configured to be provided with a capacitor in parallel with a resistor in a bias circuit, the capacitor having a sufficiently small reactance at an ultra-high frequency in the vicinity of the necessary frequency and having a large reactance at a low frequency.

CITATION LIST

Patent Literature

Patent Literature 1: Unexamined Japanese Patent Application Kokai Publication No. H11-136045

Patent Literature 2: Unexamined Japanese Patent Application Kokai Publication No. H11-41042

Patent Literature 3: Unexamined Japanese Patent Application Kokai Publication No. S62-209909

SUMMARY OF INVENTION

Technical Problem

The microwave amplifier in Patent Literature 1 uses an LC resonant circuit and suppresses mutual interaction between a plurality of communication carriers by lowering the impedance observed from the amplifier in a frequency of a beat signal that is generated between a plurality of frequencies. However, in a method described in Patent Literature 1, because an LC resonant circuit is used, inductance component exists that contribute to the electrical length even in a low frequency region, so there are cases in which low impedance at a specific frequency is achievable, conversely, impedance increases for a frequency in the expanded operating frequency band.

Due to this effect, when a plurality of communication carriers is input in a microwave amplifier under wideband operational conditions, an increase in mutual influence between communication carriers in a frequency condition of a specific beat signal has led to problems in performance degradation including gain drops, increases in the amount of distortion and the like.

The objective in Patent Literature 2, is to suppress gain in response to an input signal of a low frequency region which is not a remedy for addressing performance degradation including gain drops and increases in the amount of distortion due to mutual influence between communication carriers. Patent Literature 2, moreover, has a drawback of increasing consumption of direct current power because a resistor is added in series in the power source supply circuit.

The ultra-high frequency semiconductor circuit in Patent Literature 3 can prevent unstable operations such as oscillation of the amplifier due to external disturbances (noise and the like), feedback, and the like because gain of the ultra-high frequency semiconductor circuit can be reduced in a low frequency at which gain of a field effect transistor (FET) itself is high. However, since the beat signal is generated on the output side of the active element, the techniques in Patent Literature 3 are not sufficient for suppressing the influence of the beat signal.

This disclosure is made in order to solve the aforementioned type of problems, and thus the objective of the disclosure is to suppress extreme performance degradation caused by frequency relationship of a specific beat signal even when a plurality of communication carriers is input in a wideband.

Solution to Problem

In order to achieve the aforementioned objective, the microwave amplifier set forth in view of the present disclosure is a microwave amplifier for amplifying a microwave signal using an active element, that includes a bias circuit that includes a line having an electrical length of one quarter the wavelength at the frequency configured to be amplified by the microwave amplifier and being connected between the output terminal of the active element and a bias voltage source, and a first capacitor element connected between a terminal where the line is connected to the bias voltage source and a ground that defines a reference potential of the microwave amplifier; and a resonant circuit that includes a resistor and a second capacitor element, the resistor and the second capacitor element connected in series between the ground and the terminal where the line is connected to the bias voltage source.

Advantageous Effects of Invention

According to the present disclosure, even when a plurality of communication carriers is input at any frequency in a wideband, mutual interaction between communication carriers is suppressed, thus making stable operation possible without being influenced by the number of input communication carriers or the frequency relationship between communication carriers.

DESCRIPTION OF EMBODIMENTS

Embodiment 1

Figure 1:
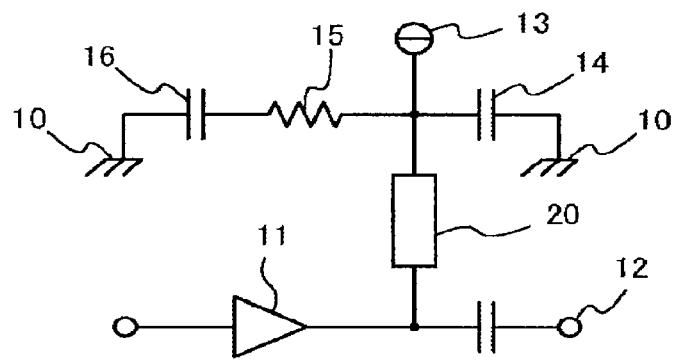
FIG. 1 is a circuit diagram of a microwave amplifier according to Embodiment 1 of the present disclosure.

FIG. 1 is a circuit diagram of a microwave amplifier according to Embodiment 1 of the present disclosure. A line 20 having an electrical length $\lambda g/4$ that is one quarter of the wavelength at a frequency $\lambda g$ configured to be amplified by the microwave amplifier is connected between an output terminal of an amplifier 11, which is an active element, and a bias voltage source 13. The amplifier 11, for example, includes a field effect transistor (FET), and a gate of FET is an input terminal whereas a drain is the output terminal. A capacitor 14 (first capacitor element) is connected between the terminal where the line 20 is connected to the bias voltage source 13 and a ground 10 that defines the reference potential of the microwave amplifier. Moreover, a resistor 15 and a capacitor 16 (second capacitor element) are connected in series between the ground 10 and the terminal where the line 20 is connected to the bias voltage source 13.

Figure 2:
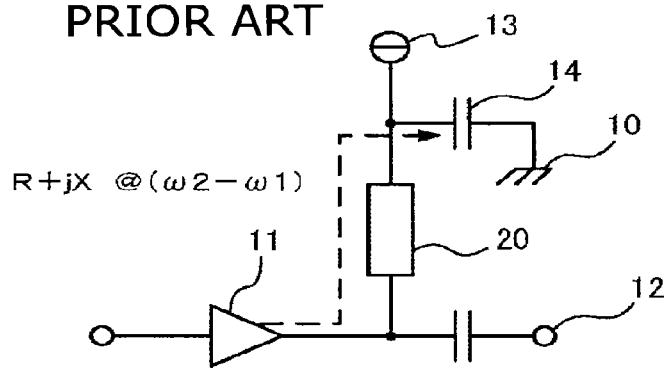
FIG. 2 is a circuit diagram of a microwave amplifier that includes a conventional bias circuit.

Hereinafter, mutual interaction between communication carriers when a plurality of communication carriers is input in a microwave amplifier at a plurality of frequencies is described. FIG. 2 is a circuit diagram of a microwave amplifier that includes a conventional bias circuit. The microwave amplifier is configured with an amplifier output port 12 that extracts frequencies of communication carriers and a port that connects the bias voltage source 13 in order to supply DC power on the output part of the amplifier 11 configured with an active element. The line 20, having a line length $\lambda g/4$ that depends on a wavelength kg of communication carriers taking into consideration a wavelength shortening rate on a printed circuit board, is connected between the amplifier 11 and the bias voltage source 13. And at an end of the line 20, it is disposed a bias circuit that includes the capacitor 14, used to short-circuit communication band signals, for forming a short-circuit point at communication carrier frequencies.

With this configuration, ideally, DC power can be supplied from the bias voltage source 13 without imposing on the amplifier 11 losses of frequencies of communication carriers. An open stub for indicating being short-circuited with respect to a communication band can be used in place of the capacitor 14, and an inductor or the like can be used as a substitute for a bias circuit.

Figure 3:
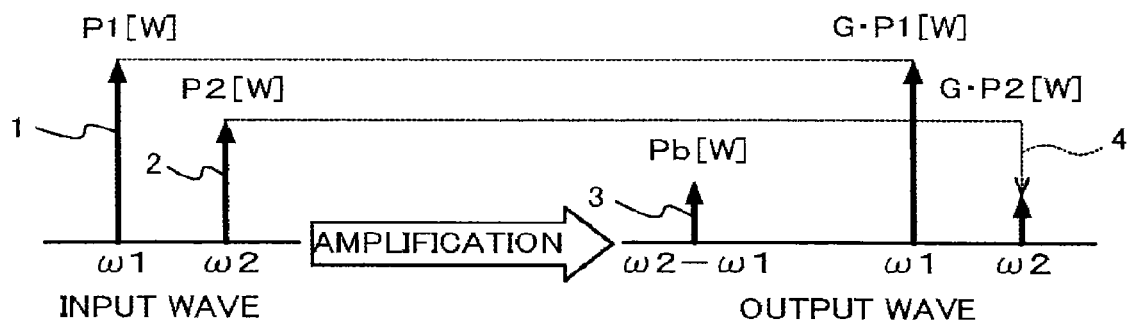
FIG. 3 is a diagram showing mutual interaction that is caused by two waves in a communication band.

FIG. 3 is a diagram showing mutual interaction that is caused by two waves in a communication band. In FIG. 3, the magnitude of power of an input wave and an output wave of the amplifier 11 each are expressed as ratios to a signal power of frequency ω1. The power of a communication carrier 1 of frequency ω1 and the power of a communication carrier 2 of frequency ω2 are power P1 [W] and P2 [W] respectively. Power P1 [W] of the communication carrier 1 is amplified by the gain G of the amplifier 11 to power G×P1 [W]. Assuming that the amplifier 11 is provided with linear gain in a frequency range including frequency ω1 and frequency ω2 and also assuming that the amplifier 11 has the same gain G at the frequency ω2 of the communication carrier 2, then the power of the output wave of the communication carrier 2 would normally become G×P2 [W] which corresponds to the total length of the solid arrow and a dotted arrow 4 directly above the solid arrow shown on the right portion of FIG. 3.

However, a beat signal 3 having a frequency of (ω2−ω1) is generated due to the communication carrier 1 (ω1) and the communication carrier 2 (ω2). The impedance (R+jX) (j: imaginary unit) of the output side observed from the amplifier 11 at a frequency of a beat signal 3 (ω2−ω1) is a finite value. Therefore a voltage fluctuation δVb in proportion to power Pb of beat signal 3 is generated on the output side of the amplifier 11.

$$\delta VB = (Pb(R+jX))^{1/2} \text{ [V]}$$

As a result, the mixing of communication carrier 1 and the beat signal 3 causes the drop of applied voltage to the communication carrier 2 and the drop of the gain for the communication carrier 2 as well. The amount of the gain drop is dependent on followings.

(1) Power Pb [W] of the beat signal 3

(2) Impedance (R+jX) [Ω] observed from the amplifier 11 at a frequency of the beat signal 3

(3) Output power (G×P1) [W] for the communication carrier 1

In other words, mutual interaction between a plurality of communication carriers (dotted arrow 4 in FIG. 3) is generated due to the beat signal 3 that occurs between the communication carrier 1 and the communication carrier 2.

Figure 4:
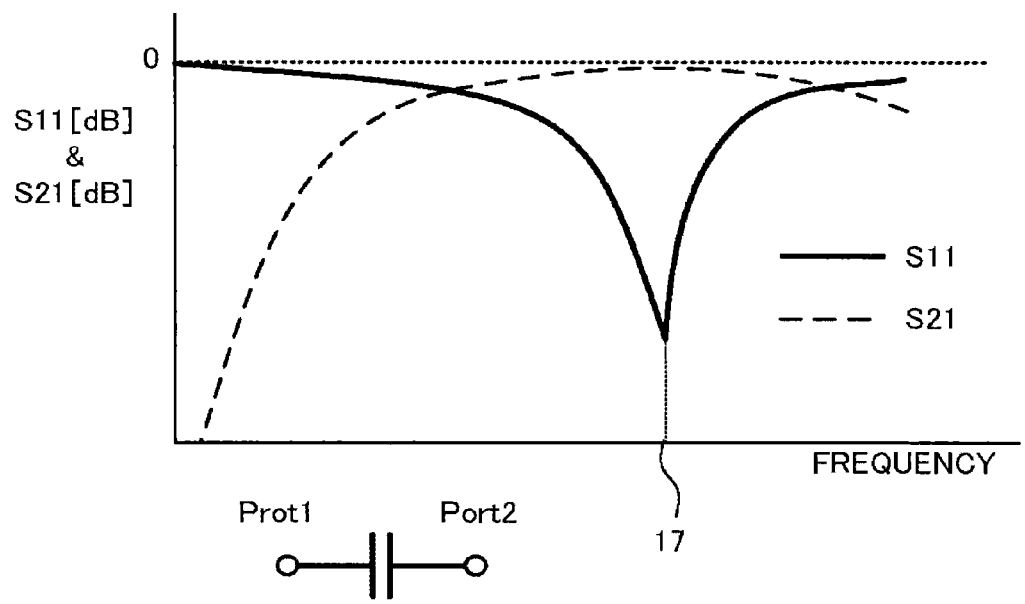
FIG. 4 is a diagram showing a characteristic example of a second capacitor element utilized by the microwave amplifier according to Embodiment 1.

The microwave amplifier according to Embodiment 1, as shown in FIG. 1, includes a series circuit of the resistor 15 and the capacitor 16 connected where capacitor 14 is connected. FIG. 4 is a diagram showing a characteristic example of a second capacitor element utilized by the microwave amplifier according to Embodiment 1. The capacitor 16 (second capacitor element) utilized by the microwave amplifier in FIG. 1 is selected such that the maximum frequency fbmax (=fH−fL) of the beat signal that is generated between the lowest frequency "fL" and the highest frequency "fH" in a frequency band configured to be amplified, as shown in FIG. 4, is lower than or equal to a self-resonating frequency 17. Also, for the resistance value of the resistor 15, for example, when a characteristic impedance of the line belongs to a 50-ohm system, it is necessary to select a value of between 25Ω-25Ω including parasitic resistance as a value that can suppress resonance.

A. Operation at a Frequency Configured to be Amplified

The capacitance of the capacitor 14 is set to short-circuit signals in communication band, therefore the capacitor 14 can be considered to be zero Ω (short-circuited) at the frequency configured to be amplified. Accordingly, the circuit on the bias voltage source 13 side cannot be observed from the connection point of the line 20 having a one quarter wavelength and the capacitor 14. Also, because the impedance on the bias voltage source 13 side as observed from the connection point of the line 20 and a main line (output side of the amplifier 11) can be considered to be infinite, output loss in the necessary frequency is not generated. At this time, as long as the capacitance of the capacitor 14 is "C1", the impedance in response to frequency $f_1$ in a communication band corresponds to the absolute value of $1/(j2\pi f_1 \times C_1)$ with "j" being the imaginary unit, and generally, the capacitance value of the capacitor is set so that the impedance value is lower than or equal to 1Ω.

B. Operation at a Frequency of a Beat Signal (Low Frequency)

Being that the capacitor 14 is for short-circuiting signals in communication band, at the frequency of the beat signal, the impedance becomes a finite value and the circuit on the bias voltage source 13 side become being observed from the connection point of the line 20 that has a one quarter wavelength and the capacitor 14. According to the impedance equal to $1/(j2\pi f \times C)$ capacitance "C" at a frequency "f", as for the impedance by the capacitor 14, when the frequency "$f_2$" of a beat signal becomes smaller compared with a communication band then the impedance also becomes larger proportion to the value of $(f_1/f_2)$.

Then, if the capacitor 16 with capacitance "$C_2$" exists on the bias voltage source 13 side of the line 20, depending on frequency $f_2$ of the beat signal 3 an impedance that corresponds to $1/(j2\pi f_2 \times C_2)$ is generated on the capacitor 16. By increasing of the value of "$C_2$", low impedance can be achieved even at a lower frequency "$f_2$" compared with a frequency "$f_1$" configured to be amplified. If the resistor 15 that connects to the capacitor 16 is sufficiently smaller than the absolute value of $1/(j2\pi f_2 \times C_1)$ then the contribution of the capacitor 14 that connects in parallel with the line becomes relatively smaller.

Therefore, the impedance on the side of the bias voltage source 13 as observed from the connection point of the line 20 that has a one quarter wavelength and the main line (output side of the amplifier 11) becomes the combined impedance of the inductance of the line 20, the resistance of the resistor 15, and the capacitance of the capacitors 14 and 16. At the frequency of the beat signal 3, the inductance of the line 20, the resistor 15, and the capacitor 16 constitute the resonant circuit.

Figure 5:
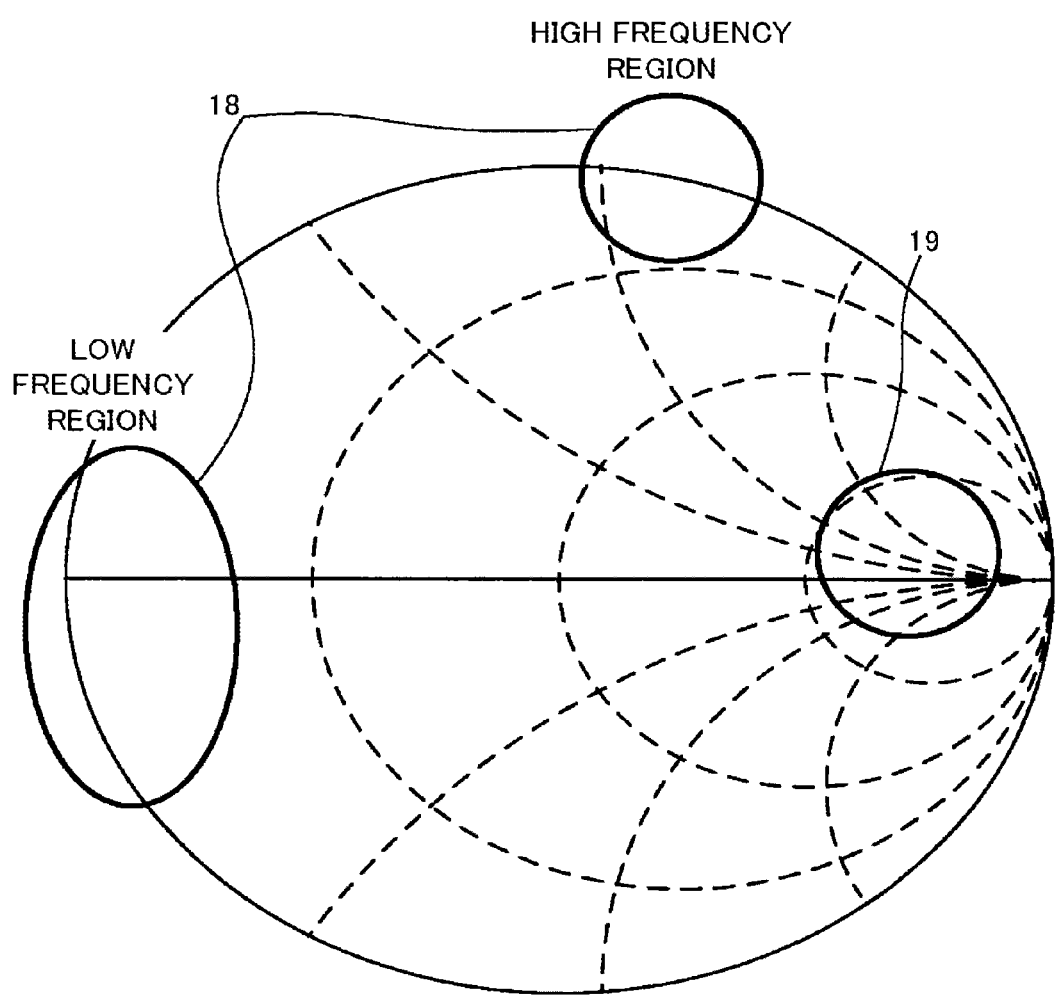
FIG. 5 is a diagram showing impedance observed from an active element in frequency regions of a beat signal.

FIG. 5 is a diagram showing impedance observed from an active element in frequency regions of a beat signal. Regions 18 indicate the range of impedance of the resonant circuit without the resistor 15. Region 19 indicates the range of impedance of the resonant circuit with the resistor 15. According to the configuration of Embodiment 1, the impedance observed from the amplifier 11 can be recognized as the impedance grouped in the region 19 of the vicinity of the real axis while avoiding the regions 18 (totally reflected or in the vicinity) shown in FIG. 5 with respect to a frequency of any beat signal generated by the frequencies of a plurality of communication carriers. The region 19 is the vicinity of the real axis located inside the circumference of the Smith chart. By increasing the contribution of the resistor 15 and the capacitor 16 in a frequency of the beat signal 3 in the impedance observed from the amplifier 11, the impedance can be set so as to be the impedance in the region 19 on the Smith chart in FIG. 5.

When two communication carriers are simultaneously input in the amplifier 11 (FET and the like), being that the beat signal 3 is generated due to the mutual interaction at the amplifier 11, a circuit that suppresses the beat signal 3 is configured on the output side of the amplifier 11. Moreover, the effect of the gain drop of communication carrier 2 caused by the beat signal 3, as shown in FIG. 3, is influenced by impedance (R+jX) [Ω] on the load side as observed from the amplifier 11 at a frequency of the beat signal 3 (ω2−ω1).

By limiting the impedance at a frequency of the beat signal 3 to specific region 19, a condition can be avoided in which a mutual interaction between a plurality of communication carriers becomes extremely large. The Smith chart in FIG. 5 shows that the impedance observed from a field effect transistor (FET) in the region of the frequency of the beat signal 3 is positioned inside the circumference of the Smith chart due to the resistor 15.

Figure 6:
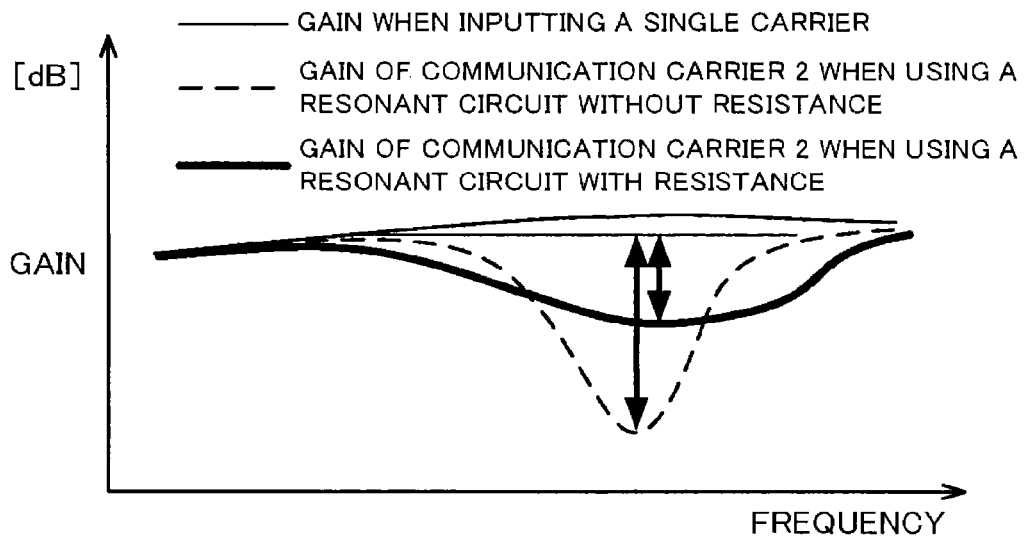
FIG. 6 is a diagram showing the variation in gain of a communication carrier due to the presence/absence of resistance in a resonant circuit when a plurality of communication carriers is input.

FIG. 6 is a diagram showing the variation in gain of a communication carrier due to the presence/absence of resistance in a resonant circuit when a plurality of communication carriers is input. By limiting the impedance at a frequency of any beat signal to specific region 19, as shown in FIG. 6, a condition can be avoided in which a mutual interaction between a plurality of communication carriers becomes extremely large. By this, problems that may arise while simultaneously using multiple communication carriers can be suppressed without causing communication line conditions to degrade even when a communication carrier of a different frequency is added while communicating with a communication carrier.

According to the microwave amplifier in Embodiment 1, the adding of resistance components to the resonant circuit, which brings an effect of lowering the "Q" value of the resonant circuit, suppresses mutual interaction between communication carriers even when a plurality of communication carriers, each of which has an arbitrary frequency in a wideband, is input. This makes stable operation possible without being influenced by the number of input communication carriers or the frequency relationship between communication carriers. According to Patent Literature 2, an effect that contributes towards stable operation can be expected when various components and the choice for placing the elements are properly selected. On the other hand, in Embodiment 1, because no resistance components are inserted on a path through which direct current flows, there is an additional advantage of being capable of performing stable operation while maintaining high efficiency performance of the amplifier itself.

Embodiment 2

Figure 7:
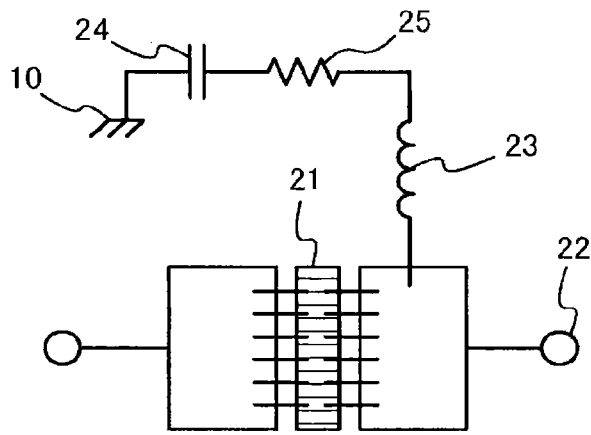
FIG. 7 is a circuit diagram of a microwave amplifier according to Embodiment 2 of the present disclosure.

FIG. 7 is a circuit diagram of a microwave amplifier according to Embodiment 2 of the present disclosure. The microwave amplifier in Embodiment 2 includes an inductor 23, a capacitor 24, and a resistor 25 connected in series between the output side of an amplifier 21 and the ground 10. The amplifier 21 includes an active element. The amplifier 21 transmits power at communication carrier frequencies and direct-current power is supplied to an amplifier output port 22.

The inductor 23, the resistor 25 and the capacitor 24 in Embodiment 2 are in a configuration in which, in place of the line 20 of Embodiment 1, the inductor 23 corresponding to the inductance of the line 20 is disposed for the frequency of the beat signal 3.

With this configuration, ideally, the impedance at a frequency of the beat signal 3 as observed from the amplifier 21 can be disposed within the region 19 in the vicinity of the real axis on the Smith chart, in the same manner as Embodiment 1, while minimizing loss of power in communication carrier frequencies and loss of DC power at the output part of the amplifier 21. Hence a condition can be avoided in which a mutual interaction between a plurality of communication carriers becomes extremely large. As a result, problems that may arise while simultaneously using a plurality of communication carriers can be suppressed without causing communication line conditions to degrade when adding a communications carrier of a different frequency while communicating with a communication carrier. Moreover, no measures are required regarding a bias circuit and/or the like disposed near the amplifier 21.

Embodiment 3

Figure 8:
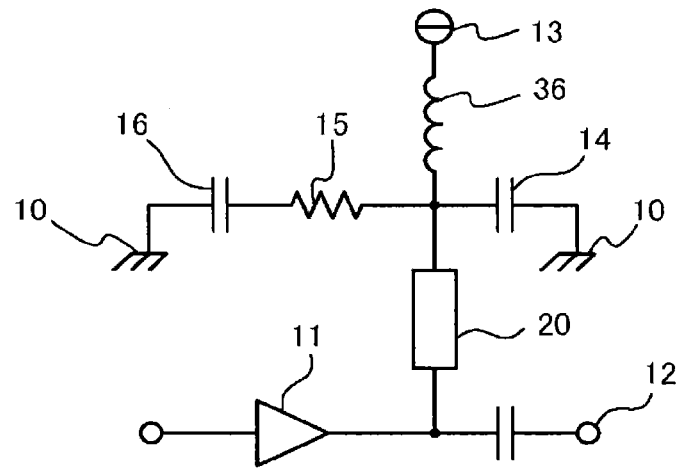
FIG. 8 is a circuit diagram of a microwave amplifier according to Embodiment 3 of the present disclosure.

FIG. 8 is a circuit diagram of a microwave amplifier according to Embodiment 3 of the present disclosure. In Embodiment 3, in comparison with the configuration of the microwave amplifier in Embodiment 1, as shown in FIG. 8, an inductor 36 is added in between the bias circuit and the bias voltage source 13. The inductor 36 passes direct current and low-frequency range signals while blocking signals with higher frequencies. The inductor 36 suppresses the influence of impedance of the power source circuit on impedance observed on the side of the bias voltage source 13 from the amplifier 11. In the microwave amplifier in Embodiment 3, as in Embodiment 1, the impedance value at the frequency of the beat signal 3 is determined by the resistor 15 and the capacitor 16.

According to the microwave amplifier in Embodiment 3, in addition to the effects described in Embodiment 1, the microwave amplifier can also suppress the influences of impedance of the power source circuit.

The present disclosure can be embodied in various ways and can undergo various modifications without departing from the broad spirit and range of the disclosure. Moreover, the embodiment described above is for explaining the present disclosure, and does not limit the range of the present disclosure. In other words, the range of the present disclosure is as set forth in the Claims and not the embodiment. Various changes and modifications that are within the range disclosed in the claims or that are within a range that is equivalent to the claims of the disclosure are also included within the range of the present disclosure.

This application claims the benefit of priority based on Japanese Patent Application No. 2012-210863, filed on Sep. 25, 2012, and including the specification, the claims, the drawings, and the abstract. The entire disclosure of Japanese Patent Application No. 2012-210863 is incorporated herein by reference.

REFERENCE SIGNS LIST 1, 2 Communication carrier
3 Beat signal
10 Ground
11 Amplifier
12 Amplifier output port
13 Bias voltage source
14 Capacitor (first capacitor element)
15 Resistor
16 Capacitor (second capacitor element)
17 Self-resonating frequency
18, 19 Region
20 Line
21 Amplifier
22 Amplifier output port
23 Inductor
24 Capacitor
25 Resistor
36 Inductor

The invention claimed is:

1. A microwave amplifier for amplifying a microwave signal using an active element comprising:
  a bias circuit including,
    a line having an electric length one quarter a wavelength at a frequency configured to be amplified by the microwave amplifier and being connected between an output terminal of the active element and a bias voltage source, and
    a first capacitor element connected between a terminal where the line is connected to the bias voltage source and a ground that defines a reference potential of the microwave amplifier; and
  a resonant circuit including a resistor and a second capacitor element connected in series between the ground and the terminal where the line is connected to the bias voltage source,
  wherein
  the first capacitor element has a reactance regarded as being short-circuited at the frequency configured to be amplified,
  the resistor has a resistance value lower than an absolute value of an impedance of the first capacitor element at a frequency of a beat signal generated between a lowest frequency and a highest frequency in a communication band of the microwave amplifier,
  an inductance of the line, the resistor, and the second capacitor element constitute a resonant circuit at a frequency of the beat signal generated between the lowest frequency and the highest frequency in the communication band of the microwave amplifier, and
  the second capacitor element has a reactance in which the impedance of the line, the resistor, and the second capacitor element is positioned in a vicinity of a real axis inside a circumference of a Smith chart at a maximum frequency of the beat signal generated between the lowest frequency and the highest frequency in the communication band of the microwave amplifier.

2. The microwave amplifier according to claim 1, comprising an inductive element connected between the line and the bias voltage source.

3. The microwave amplifier according to claim 1, further comprising an inductive element connected between the line and the bias voltage source.

* * * * *